United States Patent
Talwar et al.

(10) Patent No.: US 6,387,803 B2
(45) Date of Patent: *May 14, 2002

(54) METHOD FOR FORMING A SILICIDE REGION ON A SILICON BODY

(75) Inventors: Somit Talwar; Gaurav Verma, both of Palo Alto, CA (US); Karl-Josef Kramer, Vaihingen (DE); Kurt Weiner, San Jose, CA (US)

(73) Assignee: Ultratech Stepper, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/158,346

(22) Filed: Sep. 21, 1998

Related U.S. Application Data

(63) Continuation-in-part of application No. 08/791,775, filed on Jan. 29, 1997.

(51) Int. Cl.[7] ............................................... H01L 21/44
(52) U.S. Cl. .................... 438/682; 438/533; 438/586; 438/592; 438/619; 438/623; 438/680
(58) Field of Search .......................... 438/29, 158, 166, 438/485, 486, 533, 586, 542, 619, 623, 680, 682

(56) References Cited

U.S. PATENT DOCUMENTS

| | | | |
|---|---|---|---|
| 4,439,245 A | 3/1984 | Wu | 148/1.5 |
| 5,145,808 A | 9/1992 | Sameshima et al. | 437/173 |
| 5,162,239 A | 11/1992 | Winer et al. | 437/4 |
| 5,366,926 A | 11/1994 | Mei et al. | 437/173 |
| 5,399,506 A | 3/1995 | Tsukamoto | 437/19 |
| 5,401,666 A | 3/1995 | Tsukamoto | 437/41 |
| 5,474,940 A | 12/1995 | Tsukamoto | 21/26 |
| 5,529,937 A * | 6/1996 | Zhang et al. | 438/471 |
| 5,550,066 A * | 8/1996 | Tang et al. | 438/29 |
| 5,565,377 A | 10/1996 | Weiner et al. | 21/26 |
| 5,573,964 A * | 11/1996 | Hsu et al. | 438/158 |
| 5,612,235 A | 3/1997 | Wu et al. | 437/41 |
| 5,851,860 A * | 12/1998 | Makita et al. | 438/166 |
| 5,904,770 A * | 5/1999 | Ohtani et al. | 117/103 |

* cited by examiner

*Primary Examiner*—David Nelms
*Assistant Examiner*—Renee' R. Berry
(74) *Attorney, Agent, or Firm*—Allston L. Jones

(57) ABSTRACT

The invented method produces a silicide region on a silicon body that is useful for a variety of purposes, including the reduction of the electrical contact resistance to the silicon body or an integrated electronic device formed thereon. The invented method includes a step of producing an amorphous region on the silicon body using ion implantation, for example, a step of forming a metal layer such as titanium, cobalt or nickel in contact with the amorphous region, and a step of irradiating the metal with intense light from a source such as a laser, to cause metal atoms to diffuse into the amorphous region to form an alloy region with a silicide composition. In an application of the invented method to the manufacture of a MISFET device, the metal layer is preferably formed with a thickness that is at least sufficient to produce a stoichiometric proportion of metal and silicon atoms in the amorphous region of the gate of the MISFET device. Importantly, the irradiating step proceeds until the metal overlying the gate alloy region is consumed and the gate alloy region is exposed. The gate alloy region has a higher reflectivity than the metal layer, and thus reduces further thermal loading of the gate alloy region so that silicide growth can be continued in the source and drain regions without adversely impacting the gate of the MISFET device. The invention also includes an integrated MISFET device in which the gate silicide region is greater than the source/drain silicide region.

42 Claims, 7 Drawing Sheets

METHOD FOR FORMING A SILICIDE REGION ON A SILICON BODY

CROSS-REFERENCE TO RELATED APPLICATION

This patent application is a continuation-in-part of application Ser. No. 08/791,775 filed Jan. 29, 1997, in which the named inventors and assignee entity are the same.

BACKGROUND OF THE INVENTION

1. Field of the Invention

This invention is directed to a method for forming silicide regions on one or more transistors or other integrated devices formed on a silicon substrate. The silicide regions reduce the contact resistance of electrical connections to the integrated devices, and thus permit the devices to operate at relatively high speeds.

2. Description of the Related Art

Many techniques have been developed for forming silicide regions for integrated device contacts, particularly for metal-oxide-semiconductor (MOS) devices formed on silicon substrates. Most of these techniques involve the formation of a metal layer over a gate, drain or source region upon which the silicide is desired to be formed. These techniques then use thermal treatment for extended periods of time to react the metal with the silicon composing the gate, source, drain and exposed runners, to form low-resistivity silicide regions. The substrate is further processed by removing the unreacted metal layer. Silicide regions are thus formed over the gate, source and/or drain regions and exposed polysilicon runners.

Techniques for forming silicides are subject to several stringent process constraints that must be met in order for such techniques to be effective. These constraints include: (1) the metal used to form the silicide and the temperature at which the silicide is formed, must be carefully selected so that the metal diffuses into the silicon to avoid the formation of leakage paths between the source, drain and gate of an integrated device; (2) for self-aligned silicidation techniques, the metal layer must not react with the insulating material composing the self-aligning side walls of the gate; (3) the dopants must not segregate appreciably into the silicide regions so that low contact resistance can be achieved; (4) the technique should have a process window that allows the silicide region to be formed on both c-silicon and poly-silicon; (5) the silicide formation should be insensitive to dopants present in the silicon; and (6) the metal atoms should not diffuse beyond the silicide regions to prevent an increase in junction leakage. The simultaneous achievement of all of the above-stated criteria is at best difficult for most conventional silicidation techniques, especially those that use relatively extensive thermal treatments. Most often, a failure to perform the conventional technique within its relatively narrow process margins manifests itself in the occurrence of defects due to thermal drift of the metal atoms beyond desired boundaries during the relatively prolonged thermal treatment periods required by such techniques. If the silicide region extends beyond its design dimensions, it can cause leakage paths between the gate, source/drain and the substrate. There is therefore a great need for a technique that enhances silicidation process margins beyond those conventionally available.

In addition to conventional techniques that use prolonged thermal treatments, some conventional silicidation techniques use ion implantation to achieve formation of the silicide regions. These ion-implantation silicidation techniques use either ion beam mixing of different ion types to produce a silicide of a desired composition, or implantation of a desired species of metal ions in a proportion needed to achieve proper stoichiometry. In either of these two types of techniques, the ion-implantation is so extensive as to be extremely time-consuming, especially if a stoichiometric proportion of ions needed to make the silicide must be implanted into the silicon substrate. In addition, extensive ion implantation will eventually lead to 'knock-on', a phenomenon in which moving ions strike ions previously implanted, driving them further than desired into the silicon substrate. The occurrence of knock-on leads to increased junction leakage. Thus, there is a significant need for a technique that can overcome the above-noted disadvantages of conventional silicidation techniques.

A constraint of all silicidation techniques discussed above is that the silicide thickness of the gate and polysilicon runners is the same as that over the source/drain regions. As source/drain junctions are scaled to shallower depths, the silicide thickness over the source/drain also needs to be lowered accordingly to prevent leakage. However, silicide thickness scaling is not necessary over the gate region and it is in fact advantageous to have thicker silicide over the gate region than over the source/drain regions. Such a silicide layer can be formed either by depositing a thicker metal layer over the gate than that formed over the source/drain regions, or by subjecting the gate to a higher thermal budget. Neither of these two options are feasible using conventional silicide formation techniques.

SUMMARY OF THE INVENTION

This invention overcomes the above-noted disadvantages. A preferred embodiment of the invented method includes a step of producing an amorphous region on a silicon body, a step of forming a metal layer in contact with the amorphous region, and a step of irradiating the metal layer with light to diffuse metal into the amorphous region to form an alloy region of silicide composition from the amorphous region. The metal layer is formed on the amorphous region with a thickness that is at least sufficient to produce a stoichiometric silicide over the amorphized region, and the irradiating step proceeds until the metal overlying the alloy region is consumed. The alloy region (particularly in its molten liquid state) has a higher reflectivity than the metal layer, and thus reduces further thermal loading of the alloy region. By reducing the thermal loading of the alloy region upon consumption of the overlying metal, melting beyond the depth of the alloyed region existing upon consumption of the overlying metal can be substantially reduced or arrested.

The step of producing the amorphous region in the silicon body is preferably performed through ion implantation. The depth to which the amorphous region is formed in the silicon body is determined and controlled with high accuracy by selection of the atomic weight of the ion species used for implantation, the implantation energy, and the dosage of ions implanted in the silicon body. Knock-on of metal atoms is not an issue because the amorphization implant is performed prior to metal deposition. The step of forming or positioning the metal layer on the amorphous region is preferably performed by sputtering, evaporating or chemical vapor deposition of the metal onto the silicon body. The metal can be one of a large number of metals, including titanium, cobalt and nickel. The metal thickness is preferably at least sufficient to produce a stoichiometric silicide from the amorphized silicon. The step of irradiating the metal layer is preferably accomplished with pulsed laser light with a fluence sufficient to render the amorphous region molten while the metal layer and the silicon body remain in their solid states. By diffusion of metal from the metal layer caused by the heating produced by the irradiation step, the molten amorphous region becomes an alloy region. To melt the amorphous region while the silicon body and the metal layer remain in their solid states, the fluence of the laser light used to irradiate the metal layer is preferably in a range from 0.1 to 1.0 Joules per square centimeter. The increased reflectivity of the alloy region relative to the metal layer upon consumption of the overlying metal layer reduces thermal loading of the alloy region. Over appropriate fluences for the irradiation step, the energy reflected by the alloy region can be sufficient to arrest further growth of the alloy region. After the irradiation step, the alloy region is in a semi-crystalline state. To further improve its crystallinity and thus reduce its resistivity, the invented method can also include a step of treating the alloy region to convert it into a silicide region with a lower resistivity. Preferably, the treating step is performed by rapid thermal annealing.

In a preferred embodiment, the invented method is used to form self-aligned silicide contacts for the gate, source, drain and connection runners of a metal-insulator-semiconductor field-effect transistor (MISFET). In this embodiment, the metal layer formed in the method has a thickness that is sufficient to produce a substantially stoichiometric silicide on the gate region of the device, and preferably also on the runners that form electrical connections to the integrated device. Irradiation of the metal layer is performed with a fluence that consumes the metal overlying the gate and/or runner regions by diffusion of metal atoms into the molten regions. Alloying occurs only to the melt depth in the gate and runner regions. Upon consumption of the metal layer, the gate and runner alloy regions are exposed. Because the reflectivity of the gate and runner alloy regions formed by diffusion of metal ions is higher than that of the metal layer, further thermal loading of the gate or runner regions is reduced to a degree sufficient to prevent migration of the metal ions beyond the alloy boundaries existing in the gate and runner when the overlying metal layer is consumed. Therefore, further irradiation allows silicide growth to continue in the source and drain regions while substantially reducing or arresting further migration of the metal ions in the gate or runner regions. Accordingly, highly-defined silicides with relatively low resistivities can be formed in the source and drain regions, as well as the gate or runner regions, of the integrated device. Due to thermal trapping caused by the presence of hot source/drains next to the gate, the melt in the gate will proceed deeper than the amorphous depth at the fluence required to completely melt the amorphous region in the source/drains. Hence, over a certain fluence range, amorphization controls the silicide depth in the source/drain regions, and complete consumption of metal controls the silicide depth over the gate. As a result, the silicide thickness over the gate is greater than that over the source/drain. The integrated device formed with the invented method is therefore capable of relatively high operational speeds.

The method of this invention provides several advantages over conventional silicidation techniques. For example, in the methods of this invention, silicidation occurs only in limited portions of the source/drain regions of the silicon body that are rendered amorphous through ion implantation so that the dimensions of the silicide region can be relatively strictly controlled to avoid the formation of leakage paths and other problems that would adversely impact the electronic characteristics of the silicon body and/or any integrated devices formed thereon. Further, the use of light to irradiate the metal layer to diffuse the metal into the amorphous region(s) helps to reduce heating of the silicon body so that integrated devices formed on the silicon body are not subjected to prolonged heating that could damage such devices. In addition, the methods of this invention can be used to perform silicidation at a much faster rate compared to conventional silicidation techniques. The throughput for the silicidation of silicon bodies using the invented method is thus much greater than is possible with conventional silicidation techniques. Full consumption of the metal occurs over the gate and runner regions leading to a thicker silicide over these regions than those over the source/drain regions. Furthermore, upon consumption of the metal layer overlying the gate or runner regions in a preferred embodiment of the invented method, the reflectivity of the gate or runner region increases to reduce thermal loading of the gate or runner region. Irradiation of the metal layer overlying the source and drain regions can thus continue without adversely impacting the gate or runner regions so that relatively low-resistance silicides can be formed in the source and drain regions as well as in the gate and runner regions. With the reduced gate, source, drain and runner silicide resistivities made possible with the invented method, the resulting transistor device is capable of relatively high-speed operation.

These together with other features and advantages, which will become subsequently apparent, reside in the details of construction and operation of the invention as more fully hereinafter described and claimed, reference being made to the accompanying drawings, forming a part hereof wherein like numerals refer to like parts throughout the several views.

DESCRIPTION OF THE PREFERRED EMBODIMENTS

Figure 1A:
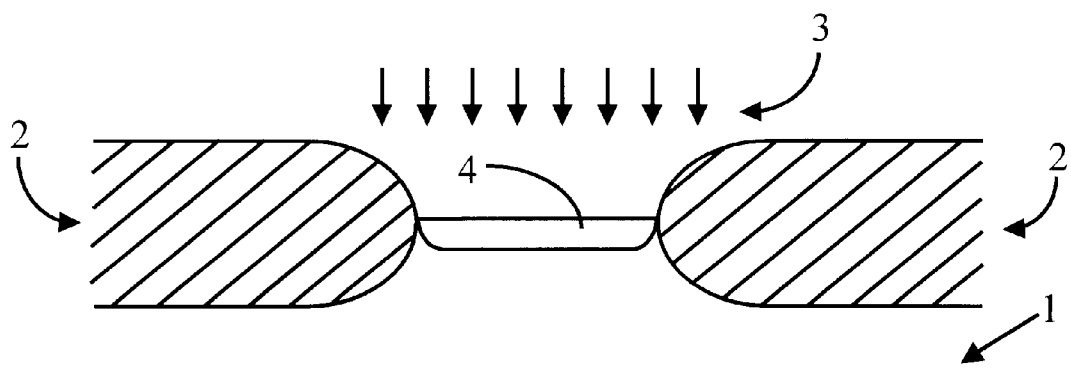
FIGS. 1A through 1F are cross-sectional diagrams of a silicon body showing steps to perform silicidation of the silicon body in accordance with a generalized method of this invention.

In FIG. 1A, a silicon body 1 is subjected to processing to form a silicide region in accordance with the invented method. The silicon body can be a silicon substrate, a silicon-on-insulator substrate, a silicon epitaxial layer, or c-silicon or poly-silicon used to form a gate for a MISFET device, for example. Using well-known techniques, field oxide isolation regions 2 are formed on the silicon body 1 so as to form a window exposing the region of the silicon body in which it is desired to form the silicide region. In accordance with the method of this invention, the exposed portion of the silicon body is rendered amorphous, preferably through the implantation of ions denoted as numeral '3' in FIG. 1A. The implanted ions destroy the chemical bonds between silicon atoms in a localized area of the substrate so that the atomic structure is made relatively disordered and random compared with the portions of the silicon body that are not subjected to ion bombardment. Preferably, the ion species, the implantation energy and the dosage are selected to produce the amorphized region 4 so that it extends to a predetermined depth in the silicon body. In general, selecting an ion species with a relatively light atomic weight, increasing the ion implantation energy, or increasing the ion dosage, will each have the effect of increasing the depth to which the amorphous region extends. Conversely, selecting an ion species with relatively heavy atomic weight, decreasing the ion implantation energy, or decreasing the ion dosage, will each have the effect of decreasing the depth to which the amorphous region extends. A number of ion species can be used to produce the amorphous region. For example, the ion species can include silicon, argon, arsenic, or germanium. The ion implantation energy can be in a range from 10 to 100 kilo-electronVolts (keV) at a dosage in a range from $10^{13}$ to $10^{15}$ ions per square centimeter. The amorphization depth is approximately equal to the thickness of the silicon consumed to form the silicide of the desired thickness. For the case of titanium silicide, approximately 0.909 Å of silicon is consumed to form 1 Å of silicide. Hence, to obtain approximately 440 Å thick titanium silicide over the source/drain regions in the preferred embodiment, 400 Å of the silicon surface should be amorphized. To produce the amorphized region to a depth of 400 Å, the inventors have determined that arsenic ions implanted at an energy of about 30 keV with a dosage of about $3 \times 10^{14}$ atoms per square centimeter will achieve amorphization of the silicon body to this depth. The ion implantation can be performed with a device such as the 9500 XR Ion Implanter commercially available from Applied Materials, Inc. of San Jose, Calif.

If the silicon body is removed from the vacuum chamber in which ion implantation is performed, the body may be exposed to the atmosphere and thus to a degree of oxidation due to the atmosphere's oxygen content. The oxidation forms a so-called 'native' oxide layer over the surface of the silicon body. So that such native oxide layer will not adversely affect subsequent processing in accordance with the methods of this invention, the native oxide layer can be stripped with an acidic solution. For example, a solution of 1:100 ratio of HF to $H_2O$ strips oxide at a rate of 20 Å per minute. A sixty second treatment of the silicon body with the acidic solution is sufficient to remove the native oxide layer. In the alternative, the invented method can be practiced in a chamber so that the amorphous region is not exposed to an oxidizing environment before the formation of the metal layer thereon, thus altogether avoiding the formation of an oxide layer that would require removal.

Figure 1B:
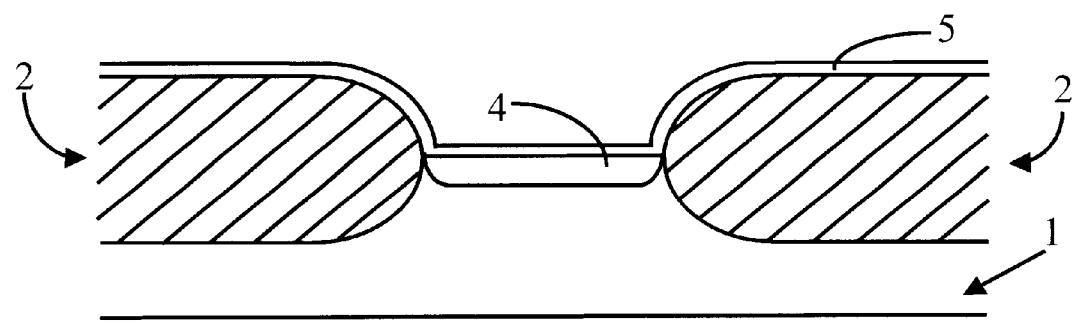

In FIG. 1B, a metal layer 5 is formed over the surface of at least the amorphous region 4. The metal layer supplies the metal atoms needed to form the desired silicide compound for electrical contact with the silicon body. With the invented method, a number of metal species can be used to form the silicide compound. For example, the metal layer can include titanium, cobalt or nickel used to form the silicides $TiSi_2$, $CoSi_2$, or $NiSi$ with resistivities of 15–20 $\mu\Omega\cdot cm$, 17–20 $\mu\Omega\cdot cm$, and 12–15 $\mu\Omega\cdot cm$, respectively. The metal layer is formed preferably by sputtering, but evaporation or chemical vapor deposition can also be used. For example, to form the metal layer, a suitable sputtering chamber is the Endura™ VHPPVD commercially available from Applied Materials, Inc. of San Jose, Calif. Preferably, the metal layer is formed in a thickness that is determined based upon the desired silicide thickness or depth and the stoichiometric proportion of silicon and metal consumed to form the silicide. More specifically, the metal layer thickness should be greater than the amorphized silicon depth divided by the ratio of silicon-to-metal consumed to form stoichiometric silicide. Thus, to react titanium with 400 Å amorphous silicon to form 440 Å of amorphous silicide, due to the atomic structure of this particular silicide, 2.27 Å of silicon is consumed per 1 Å of titanium. The thickness of the metal should therefore be greater than 400 Å/2.27≅175 Å to ensure that a stoichiometric silicide of the desired depth can be formed.

Two fluence regimes exist in which the silicide depth does not vary with increasing laser fluence. The first regime is discussed in U.S. application Ser. No. 08/791,775 filed Jan. 29, 1997 naming Somit Talwar et al. as inventors, where the laser fluence is in a range so that the melting proceeds to the amorphous crystalline interface and not beyond it. The second regime is in the fluence range where the melt is deep enough to fully consume the overlying metal. Once the alloy is exposed, the light absorption is reduced dramatically due to the higher reflectance of (1) the alloy and (2) the molten alloy's surface. Hence, increasing fluence does not result in a deeper melt and consequently, the silicide depth does not change for this particular range of fluence. To summarize, in the first fluence regime, silicide depth is controlled by the amorphization process and in the second regime, it is controlled by the thickness of the deposited metal.

Figure 1C:
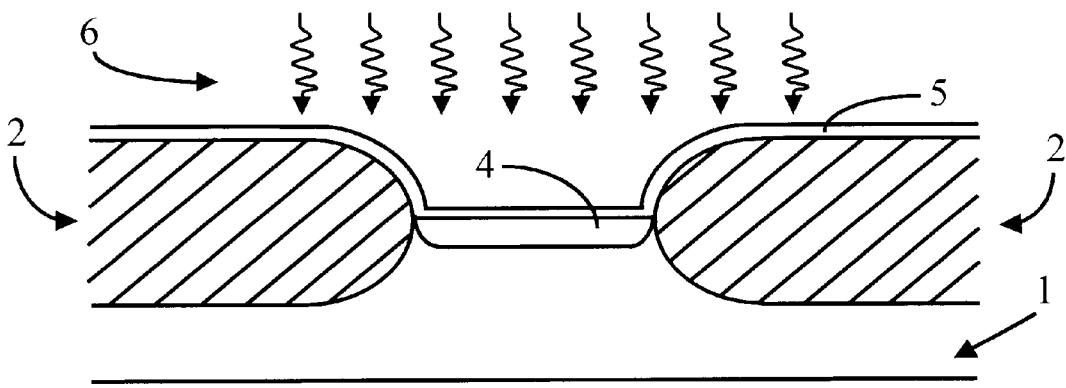

In FIG. 1C, the metal layer is irradiated with light designated numeral '6.' To be in the first fluence regime, the light is generated by a laser with sufficient power to produce the amorphous region molten, and yet with insufficient power to melt the silicon body or the metal layer 5. Because the chemical bonds of the amorphous region have been broken, it becomes molten at a lower temperature than the other portions of the silicon body that are more atomically ordered. In general, it has been determined that the laser light must be applied over several pulses to ensure complete mixing of the metal in the silicon. Each laser pulse has a pulsewidth between 10 to 100 nanoseconds. The repetition rate of the laser pulses can be between 1 to 1000 Hertz. Between laser pulses, the substrate is allowed to cool to room temperature. The exact laser fluence, number of shots, shot duration and repetition rate that will be needed to operate within the process margin for the invented method will vary between different kinds of laser devices and the desired silicide thickness. For the Model No. 4308 laser commercially available from Lambda Physik, Inc. of Fort Lauderdale, Fla., this fluence is 0.3–0.5 Joules per square centimeter ($J/cm^2$), delivered in 10 shots of 20 nanosecond pulsewidth at a repetition rate of 300 Hertz for a silicide thickness of about 400 Å. The irradiation of the metal layer 5 is preferably performed in a chamber with an inert atmosphere of nitrogen, argon or helium. A suitable chamber is the Projection-Gas Immersion Laser Annealing (P-GILA) machine commercially available from Ultratech Stepper, Inc. The inventors have determined that, with proper delivery of the laser light in accordance with the above-described guidelines and principles, the temperature window over which the amorphous region is molten while the silicon body and metal layer remain in their solid states, occurs over a relatively large range of about 260° Celsius (C) from 1150° C. to 1410° C. Thus, this method greatly enhances the process margin available for successful performance of the invented method relative to conventional silicidation techniques.

Figure 1D:
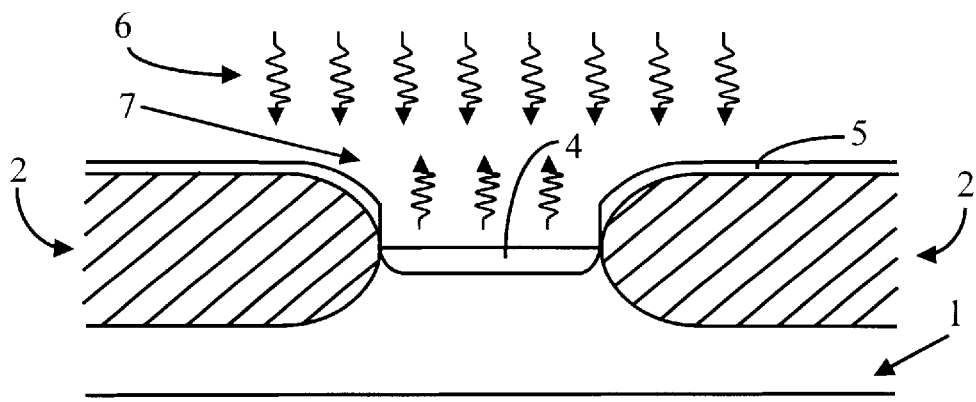

The preferred fluence range of the first regime for this invention produces a melt deep enough to fully consume the overlying metal and form a stoichiometric alloy as shown in FIG. 1D. The metal layer 5 reflects about 40% of the light incident thereto. The reflectivity of the molten alloy is about 70%. Hence, once the alloy is exposed to the incident light, it reflects over 30% more light (designated '7' in FIG. 1D) as compared to that reflected from the metal layer 5. The increased reflectivity of the exposed alloy is sufficient to arrest significant melting of the silicon under the alloy for a large fluence range. This fluence range is 0.1–1.0 J/cm$^2$ delivered in 3–10 shots with a pulse width of 10 to 100 nanoseconds with a repetition rate of 1–10 KHz. The preferred fluence range is 0.4–0.5 J/cm$^2$ delivered in 10 shots with a pulse width of 20 nanoseconds.

Figure 1E:
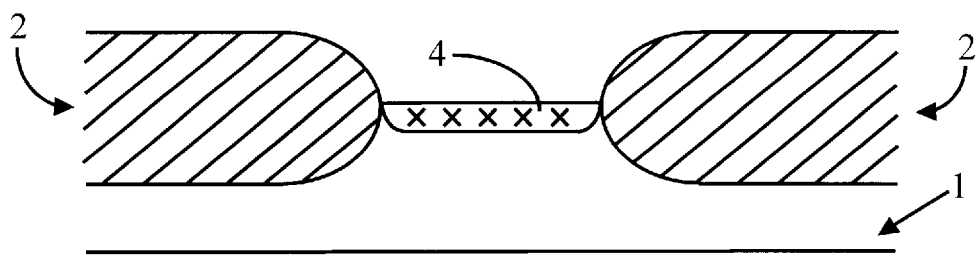

Upon cooling after light irradiation, the molten alloy solidifies and becomes an alloy region that has the desired composition for the silicide that is to be formed on the silicon body. The alloy region has a partially-crystallized state in which the atoms of the silicide are relatively ordered, yet not entirely so. For TiSi$_2$ silicide, this partially crystallized phase is referred to as its 'C49 phase.' In FIG. 1E, the metal layer is stripped from the silicon body. The stripping of the metal layer can be performed with a 4:1 solution of sulfuric acid (H$_2$SO$_4$) and hydrogen peroxide (H$_2$O$_2$) heated to 80° Celsius. Typically, immersion of the silicon body for about ten minutes is all that is required to remove the metal layer, although the time necessary to strip the metal layer can vary to a degree depending upon the type of metal and its thickness. Immersion can be performed in a spray etch tool like the Equinox™ made by SEMITOOL™ of Kalispell, Mont. The silicon body is then subjected to treatment to convert the alloy region 4 into a crystalline silicide region with the desired low-resistivity property. The crystalline silicide region is indicated by 'x' hatching in FIG. 1E. Preferably, rapid thermal annealing is used to convert the alloy region into a highly-crystalline silicide region. The rapid thermal treatment can be performed by subjecting the silicon body to a temperature of 500°–900° C. for a time duration ranging from 1 hour down to 10 seconds. The specific temperature and time duration are selected within these ranges so that, if the temperature is relatively high, the treatment duration is relatively short, and vice versa. Preferably, for TiSi$_2$ silicide, the silicon body is subjected to rapid thermal annealing at a temperature of 850° C. for 20 seconds to convert the alloy region into the desired silicide. The atmosphere in which the silicon body is placed during rapid thermal annealing should be inert. Accordingly, for example, the rapid thermal annealing should be performed in a chamber containing a nitrogen atmosphere. The rapid thermal annealing can be performed in a Rapid Thermal Processing tool designated Centura™ that is commercially available from Applied Materials, Inc. of San Jose, Calif.

Figure 1F:
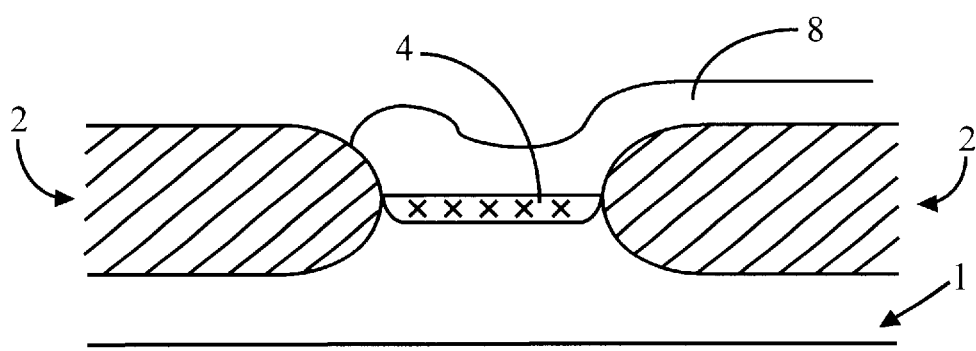

Once the silicide region 4 has been formed, a metal contact 8 can be made to establish a low-resistivity electrical connection to the silicide region, as shown in FIG. 1F. The formation of such conductive contacts is well-known in integrated circuit technology. If desired, an additional SiO$_2$ layer (not shown) can be formed over the contact 8 for electrical insulation thereof. The invented method described above with reference to FIGS. 1A through 1F is relatively generalized, pertaining to the formation of a silicide region with one of a wide variety of possible compositions on any silicon body. The invented method can be applied to produce self-aligned silicide regions on a metal-insulator-semiconductor field-effect transistor (MISFET) (which term includes a 'MOSFET' within its meaning), as described hereinafter in FIGS. 2A through 2J.

Figure 2A:
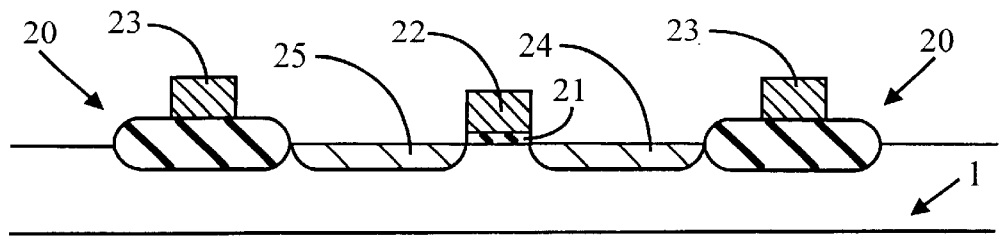
FIGS. 2A through 2J are cross-sectional diagrams of a silicon body showing steps of the invented method as applied to self-aligned silicidation of the contacts for the gate, drain and source of an integrated MISFET device.

FIGS. 2A through 2J are cross-sectional diagrams of the invented method as applied to self-aligned silicidation of the contact regions for the gate, source and drain, and connection runners of an integrated MISFET device formed on a silicon substrate 1. In FIG. 2A, field insulator layers 20 are formed to electrically isolate an area of the silicon body 1 in which the MISFET device is to be formed. Using techniques and materials that are well-known to average-skilled persons in this technology, a gate insulator layer 21 is formed on the surface of the silicon substrate 1. The gate insulator layer 21 can be an oxide layer, for example, in which case the resulting device is a MOSFET. Poly-silicon or amorphous silicon layers 22, 23 are then deposited by low pressure chemical vapor deposition, for example, on the gate insulator layer 21 and the field insulator layers 20, respectively (in general, the layers 22, 23 can be formed in the same process step of the same silicon material: the layers 22, 23 are numbered differently to distinguish the silicon layers overlying the field insulator layers 22 and the gate insulator layers 23). The silicon layer and gate insulator layer are patterned using at least one resist layer to selectively form or etch the silicon layer and the gate insulator layer to form the silicon gate body 22, the runners 23, and the gate insulator layer 21, as shown in FIG. 2A. Drain and source regions 24, 25 are then doped with appropriate n- or p-type dopants. If the silicon body 1 is n-type, the drain and source regions are doped with p-type dopants. On the other hand, if the silicon body 1 is n-type, the drain and source regions are doped with p-type dopants.

Figure 2B:
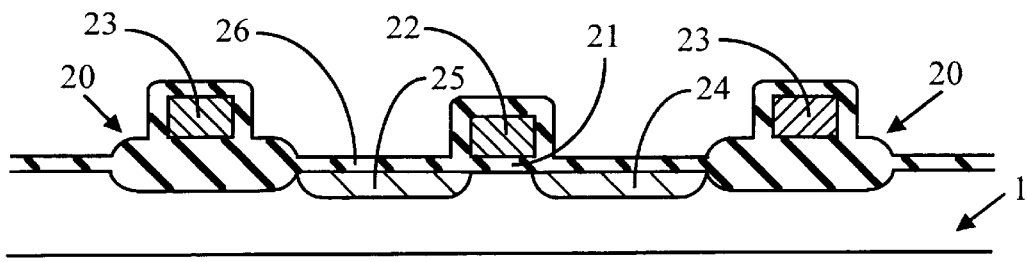
Figure 2C:
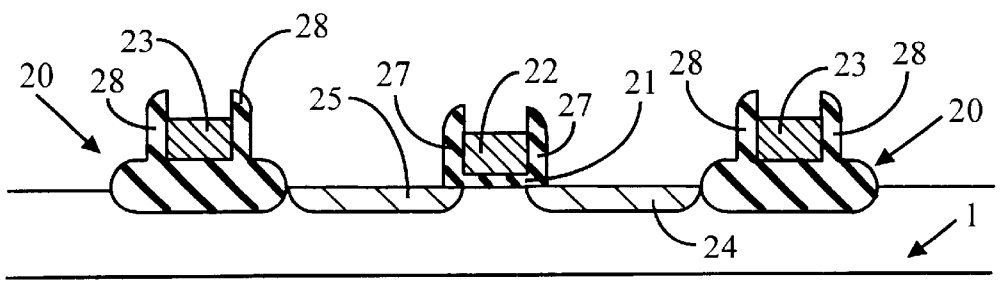

In FIG. 2B, an insulator layer 26 is formed over the silicon body 1, the silicon gate body 22 and the runners 23. The insulator layer 26 is then anisotropically etched to form insulator side walls 27, 28 on the sides of the silicon gate body and the runners 23, respectively, as shown in FIG. 2C. The side walls 27, 28 help to achieve self-alignment of the position of the silicide regions yet to be formed.

Figure 2D:
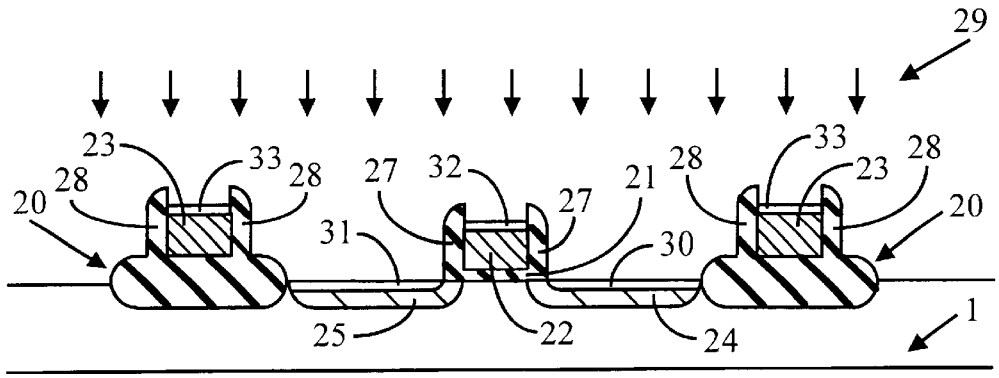

In FIG. 2D, ions 29 are implanted to form the amorphous regions 30, 31, 32, 33 over the source, drain, gate and runner regions, respectively. The ion species, implantation energies and dosages for the ion implantation are preferably as previously described with respect to FIG. 1A. If the amorphous regions are exposed to atmosphere, the surfaces of at least the amorphous regions 30, 31, 32, 33 are stripped with an acidic solution to remove any native oxide film, as previously described with respect to FIG. 1B, to remove any native oxide layer that may have formed on the amorphous regions 30, 31, 32, 33 upon exposure to the atmosphere.

Figure 2E:
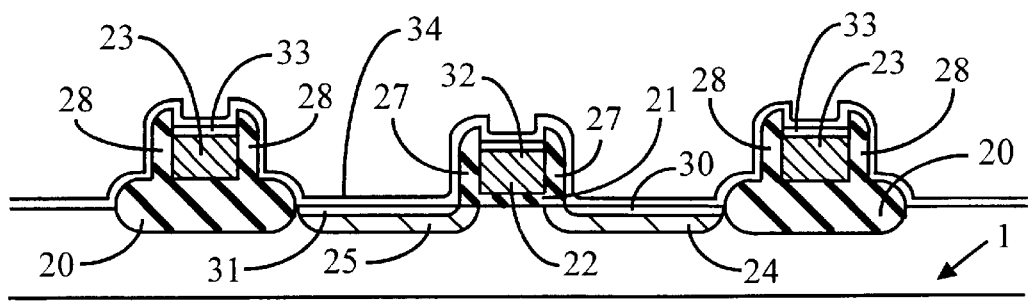

In FIG. 2E, a metal layer 34 is formed or positioned adjacent to at least the amorphous regions 30, 31, 32, 33. Preferably, the metal layer 34 is a species such as titanium, cobalt or nickel formed on the amorphous regions by sputtering, evaporation or chemical vapor deposition, as previously described with respect to FIG. 1B. The metal layer 34 is preferably formed with a thickness that is sufficient to produce a stoichiometric silicide from the amorphized silicon.

Figure 2F:
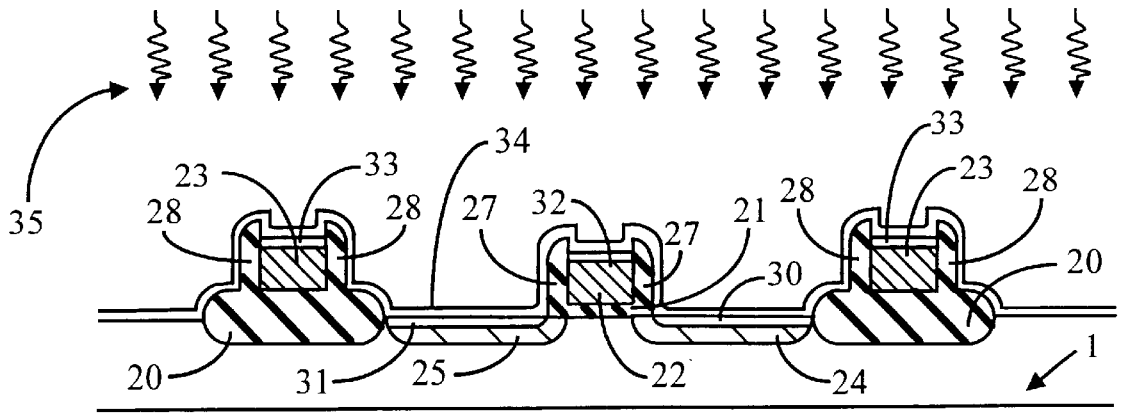

In FIG. 2F, the metal layer 34 is irradiated with light 35 of a fluence, number of shots, shot duration and repetition rate as previously described with respect to FIG. 1C. The light 35 heats the amorphous regions 30, 31, 32, 33 sufficiently to render these regions molten, yet does not heat the silicon substrate 1, the gate insulator layer 21, the side walls 27, 28 or the field insulator regions 20 to their respective melting temperatures. Due to the heating action of the light 35, metal atoms diffuse from the metal layer 34 into the melted regions 36, 37, 38, 39 so that the amorphous regions become respective alloy regions of silicide composition.

Figure 2G:
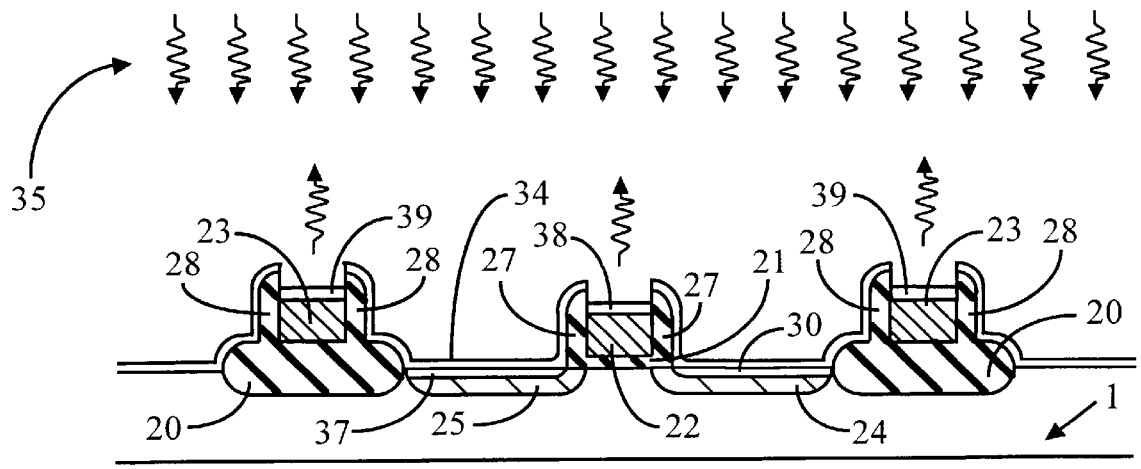

As shown in FIG. 2G, the light 35 is irradiated onto alloy regions 36, 37, 38, 39 with a fluence that completely consumes the metal layer overlying the gate silicon body 22, and preferably also the runner bodies 23. The resulting alloy regions 38, 39 extend into the layers 22, 23 to a greater depth than those of the respective amorphous regions as the amorphous silicon mixes with the metal atoms. For example, for a titanium metal layer of about 160 Å used to form a titanium silicide alloy region extending to a depth of 400 Å, the energy fluence of the light 35 is preferably in a range from 0.30 to 0.50 J/cm$^2$. In general, because the gate insulator layer 21 and the isolation regions 20 are relatively poor thermal conductors and because the source and drain alloy regions 36, 37 are integral with the substrate that acts as a heat sink, the metal layer 24 overlying the gate alloy region 38 and the runner alloy regions 39 will tend to be consumed at a lower laser fluence than that required to consume the metal layer at locations overlying the source and drain alloy regions 36, 37. Also, the metal layer overlying the silicon runners will generally be consumed at a higher fluence than the metal layer overlying the gate silicon body 22. Upon consumption of the metal layer 34 overlying the gate alloy region 38 and the runner alloy regions 39, the surfaces of the gate and runner alloy regions are exposed and reflect an increased amount of light 40 relative to the metal layer 34. The increased reflection of the light energy from the gate alloy regions 38 and the runner alloy regions 39 lowers the energy absorbed by these regions relative to other regions covered by the metal layer 34.

The light fluence is preferably determined so that the melt over the gate and poly-runner regions is deep enough to fully consume the metal overlying these regions and the melt over the source/drain regions is limited to the amorphous depth. Since there is a range of fluence for which the alloy melt depth over the gate and runners does not increase, once the overlying metal is fully consumed, and because there is a fluence range for which the melt depth over the source/drain regions does not extend beyond the amorphization depth due to difference in amorphous and c-silicon melt temperature, for fluences overlapping these two regimes, the silicide thickness over the gate and runners equals the expected thickness upon complete consumption of the metal layer, and the silicide thickness over the source/drain regions equals that expected for full consumption of the amorphized silicon layer.

Figure 2H:
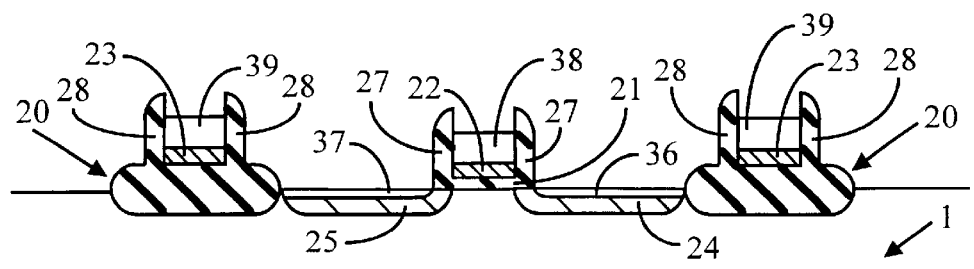
Figure 2I:
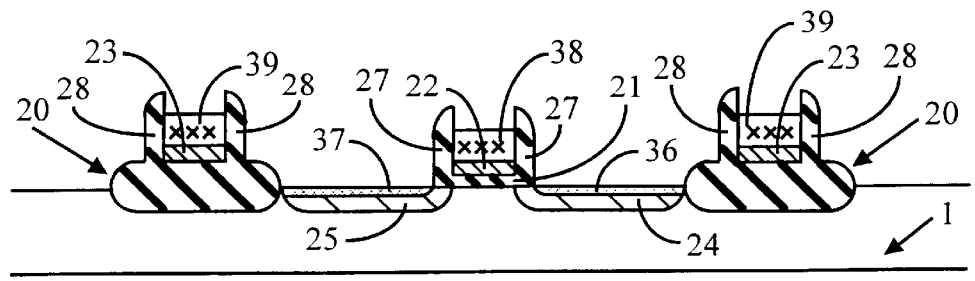

In FIG. 2H, the unconsumed metal layer 34 is stripped from the surfaces of the field insulators 20, the side walls 27, 28 and the alloy regions 36, 37, preferably using an acidic solution as described with respect to FIG. 1D. In FIG. 2I, the alloy regions 36, 37, 38, 39 are subjected to treatment to further crystallize the alloy regions into chemical forms with highly-ordered atomic structures so that the regions become silicide regions with the desired low-resistivity characteristics. The crystalline silicide regions 36, 37, 38, 39 are indicated by 'x' hatching in FIG. 2I. Preferably, the treatment of the alloy regions to form respective silicide regions is performed with rapid thermal annealing, as previously described with respect to FIG. 1E.

Figure 2J:
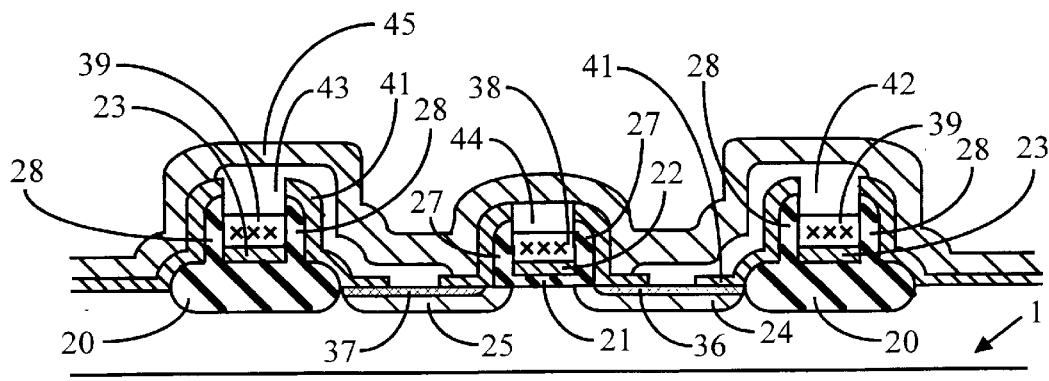

In FIG. 2J, an insulator layer 41 is formed on the field insulator regions 20, the silicide regions 36, 37, 38, 39, and the side walls 27, 28. The insulator layer 41 is selectively patterned to expose the silicide regions 36, 37, 38, 39. Conductive leads 42, 43, 44 composed of aluminum or other conductive metal, are formed and patterned so as to make electrical contact with the silicide regions 36, 37, 38, 39 of the MISFET device. More specifically, the lead 42 electrically connects the runner silicide 39 on the right-hand side of FIG. 2J to the source silicide 36, the lead 43 electrically connects the runner silicide 39 on the left-hand side of FIG. 2J to the drain silicide region 37, and the lead 44 is connected to the gate silicide region 38. The leads 42, 43, 44 can thus be used to transmit electric signals to and from respective terminals of the MISFET device. An insulator layer 45 composed of silicon oxide, for example, can be formed over the conductive leads 42, 43, 44 to electrically insulate and protect the conductive leads and the MISFET device. At respective ends opposite those in contact with the silicide regions 36, 37, 38, 39, the leads 42, 43, 44 are coupled to other electronic components, and/or power or signal sources.

Figure 3:
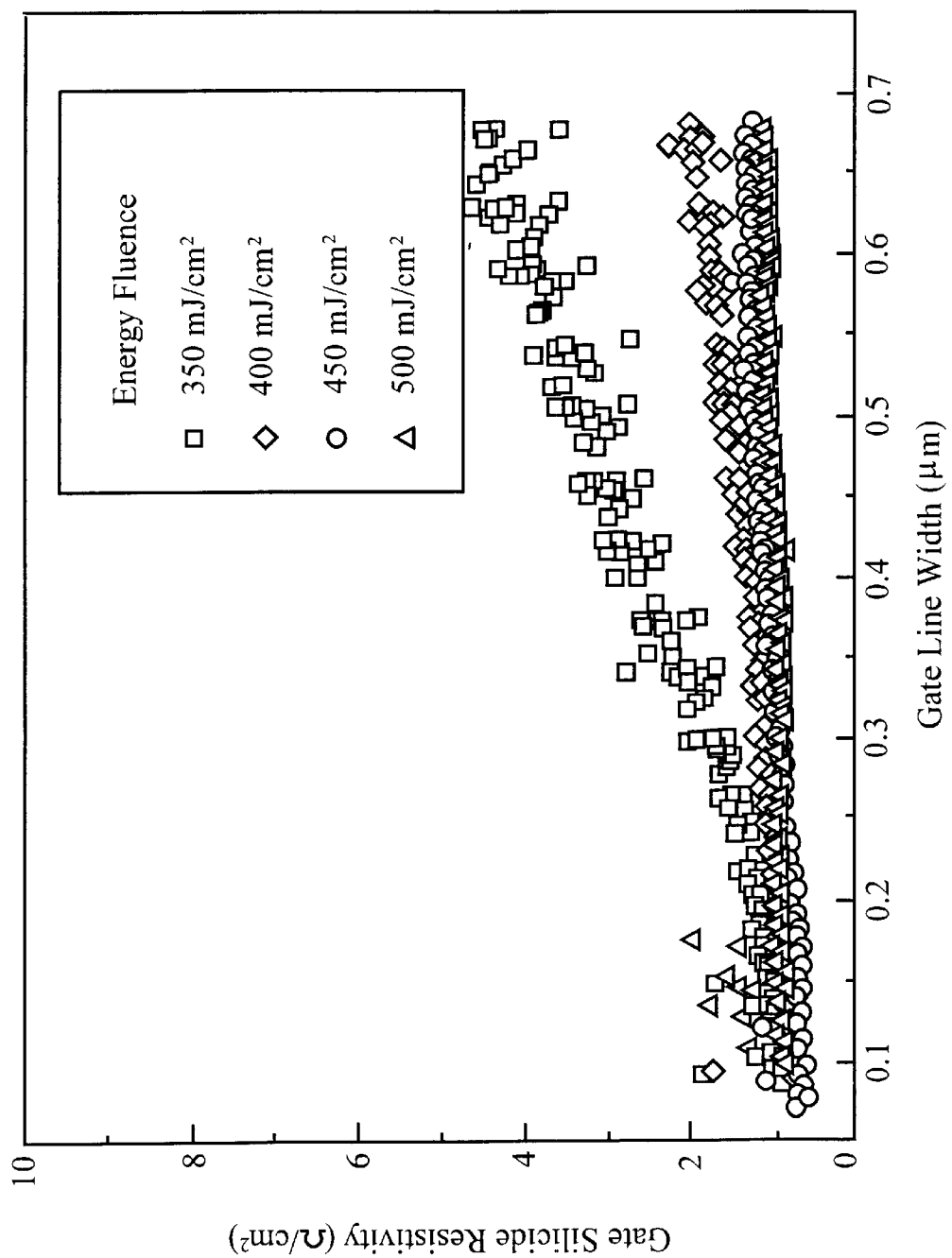
FIG. 3 is a graph of gate silicide resistivity versus line width for selected energy fluences.

FIG. 3 is a graph of gate resistivity versus line width for a titanium silicide gate region of an integrated MISFET device made using the invented method. As can be seen in FIG. 3, the value of the resistivity of the silicide gate region formed with a fluence of 350 mJ/cm$^2$ has a relatively great dependence upon the lateral width of the gate. In contrast, at energy fluences of 400 and 450 mJ/cm$^2$, the resulting gate silicide resistivities are relatively constant and low, about 1 ohm per square centimeter, over a broad range of gate widths. Thus, energy fluences in a range of 350–500 mJ/cm$^2$ can be employed given gates of relatively small (i.e., submicron) geometry with a range of 400 to 500 mJ/cm$^2$ being preferred for the formation of titanium silicide because the resulting silicide resistivity is relatively low and independent of the gate width.

Figure 4:
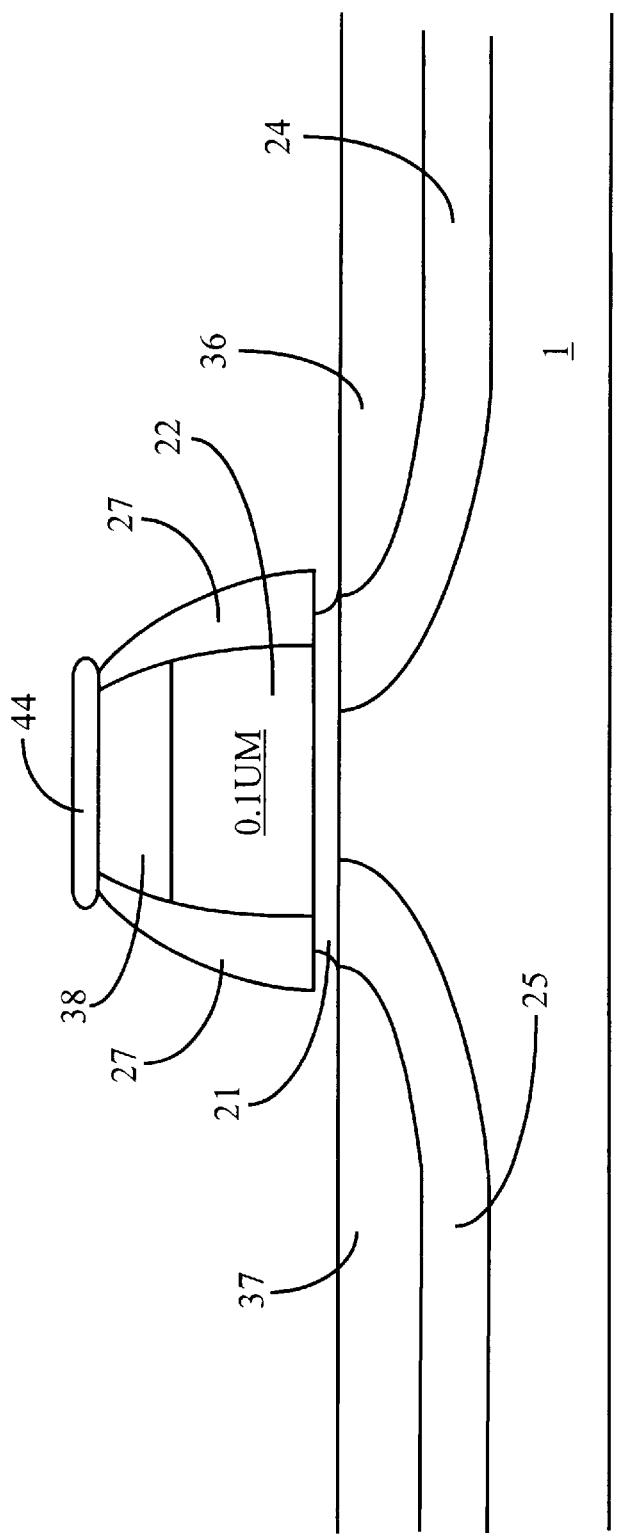
FIG. 4 is a photograph of a cross-section of a MISFET device made with the invented method.

FIG. 4 is a photograph of a cross-section of a gate region of a MISFET device formed with the invented method. The gate width is relatively small, about 0.2 micrometers wide, and has a silicide region 36, 37 that extend to a depth of about 400 Å in the source/drain regions and a gate silicide region 38 that extends to about 1000 Å into the gate silicide body 22. The resulting gate silicide region 38 has a resistivity of about one ohm per square centimeter.

The many features and advantages of the present invention are apparent from the detailed specification and thus, it is intended by the appended claims to cover all such features and advantages of the described method and device which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claims.

What is claimed is:

1. A method for forming a silicide region on a silicon body, said method comprising the steps of:
    a) producing an amorphous region on the silicon body;
    b) forming a metal layer in contact with the amorphous region; and
    c) irradiating the metal layer with light to initiate melting of said amorphous region and to diffuse metal of said matel layer into the amorphous region to form an alloy region of silicide composition, with the irradiaiting step proceeding at least until the metal layer is consumed by the amorphous region exposing a molten surface of the alloy region with increased reflectivity relative to the metal reflectivity of the metal layer being sufficient to prevent further significant melting of the alloyed region by reflecting significantly more of the irradiating light than initially reflected by the metal layer.

2. A method as claimed in claim 1, further comprising the step of:
    d) treating the alloy region to form a low-resistivity silicide region from the alloy region.

3. A method as claimed in claim 2, wherein said treating step (d) is performed by subjecting at least the alloy region to rapid thermal annealing.

4. A method as claimed in claim 2, further comprising the step of:
   e) patterning said silicon body with at least one insulator layer and at least one conductive layer to form a conductive lead that contacts the silicide region.

5. A method as claimed in claim 1, wherein said producing step (a) is performed by implanting ions in the silicon body to form the amorphous region.

6. A method as claimed in claim 5, wherein the ions include at least one of silicon, argon, arsenic and germanium.

7. A method as claimed in claim 6, wherein the ions are implanted with an energy in a range from 10 to 100 kilo-electronVolts (keV).

8. A method as claimed in claim 6, wherein the substep of implanting is performed with a dosage in a range from $10^{13}$ to $10^{15}$ atoms per square centimeter.

9. A method as claimed in claim 5, further comprising the step of:
   d) selecting at least one of ion species, ion energy and ion dosage to form the amorphous region to a controlled depth,
   said implanting substep performed based on said step (d).

10. A method as claimed in claim 1, further comprising the step of:
    d) stripping an oxide layer from the silicon body after performing said step (a) and before performing said step (b).

11. A method as claimed in claim 10, wherein said stripping step (d) is performed by immersing the silicon body in an acidic bath.

12. A method as claimed in claim 1, wherein said forming step (b) is performed by sputtering metal onto the amorphous region to form the metal layer.

13. A method as claimed in claim 12, wherein the metal includes at least one of titanium, cobalt, and nickel.

14. A method as claimed in claim 1, wherein said forming step (b) is performed by evaporating metal onto the amorphous region to form the metal layer.

15. A method as claimed in claim 1, wherein said forming step (b) is performed by forming the metal layer on the amorphous region by chemical vapor deposition.

16. A method as claimed in claim 1, wherein the metal layer is formed with a thickness greater than the depth to which the amorphous region is formed in the silicon body, divided by a consumption ratio of silicon to the metal of the metal layer.

17. A method as claimed in claim 1, wherein said irradiating step (c) is performed by irradiating the metal layer with laser light.

18. A method as claimed in claim 17, wherein the laser light has a fluence that causes the amorphous region to melt while the metal layer and the silicon body remain in solid states.

19. A method as claimed in claim 18, wherein the fluence is in a range from 0.1 to 1.0 Joules per square centimeter.

20. A method as claimed in claim 17, wherein the metal layer is irradiated by the laser light in a series of shots.

21. A method as claimed in claim 1, wherein the silicon body is situated in an ambient medium including at least one of argon, helium and nitrogen during performance of said irradiating step (c).

22. A method for forming a silicide region on a silicon body, said method comprising the steps of:
   a) forming a field isolation layer on a silicon substrate;
   b) forming a first insulator layer on the silicon substrate;
   c) forming silicon regions over the first insulator layer and the field isolation layer;
   d) patterning the silicon regions of step (c) and the first insulator layer to produce a gate silicon region overlying a gate insulator layer and at least one runner over the field isolation layer;
   e) doping at least regions of the silicon substrate adjacent the gate silicon region to form source and drain regions on the silicon substrate;
   f) forming a second insulator layer over the gate silicon region, the runner and the silicon substrate;
   g) etching the second insulator layer to form side walls in contact with the side of the gate silicon region and the runner;
   h) producing amorphous regions in the gate, source, drain and runner regions;
   i) forming a metal layer in contact with the amorphous regions;
   j) irradiating the metal layer with light to melt underlying amorphous regions and to diffuse metal thereinto to form molten alloy regions of silicide composition, with the irradiating step continuing at least until after the metal overlying the gate alloy region is consumed so that the increased reflectivity of the molten surface of the gate alloy region relative to the reflectivity of the metal layer of step (i) reduces thermal loading of the gate alloy region by reflecting significantly more of the irradiating light than initially reflected by the metal layer as the source and drain alloy regions continue to grow;
   k) removing an unconsumed portion of the metal layer; and
   l) treating the alloy regions to form silicide regions.

23. A method as claimed in claim 22, further comprising the steps of:
   m) forming a third insulator layer over the silicon substrate;
   n) patterning the third insulator layer to selectively expose the gate, source, drain and runner regions; and
   o) forming conductive leads on the third insulator layer that contact the gate, source, drain and runner regions.

24. A method as claimed in claim 22, wherein said producing step (h) is performed by implanting ions to form the amorphous regions.

25. A method as claimed in claim 22, wherein said forming step (i) is performed by sputtering the metal layer onto the amorphous regions.

26. A method as claimed in claim 22, wherein the light used to irradiate the substrate in step (j) is laser light.

27. A method as claimed in claim 22, wherein the metal layer is formed in said step (i) with a thickness that is approximately sufficient to produce a stoichiometric alloy region in at least the gate.

28. A method as claimed in claim 22, wherein said step (j) is continued after consumption of the metal layer overlying the gate region to continue growth of the alloy regions in the source and drain regions.

29. A method for forming a silicide region on a silicon body, said method comprising the steps of:
   a) amorphizing regions on a gate, source, and drain of an integrated device formed on a silicon substrate;
   b) forming a metal layer in contact with the amorphized regions;

c) irradiating the amorphized regions with light of an energy fluence sufficient to melt the amorphized region, yet insufficient to melt the metal and the silicon body to diffuse into the amorphized regions to form molten alloy regions of silicide composition, with the irradiating step continuing at least until the metal layer overlying the gate region is consumed so that the increased reflectivity of the molten surface of the gate alloy region relative to the reflectivity of the metal layer reduces further thermal loading of the gate region by reflecting significantly more of the irradiating light than initially reflected by the metal layer.

30. A method as claimed in claim 29, wherein the irradiating step is continued after the consumption of the metal layer overlying the gate region so that diffusion of metal into the alloy regions in the source and drain continues as the increased reflectivity of the gate alloy region substantially arrests further melting of the gate region so that the gate alloy region does not significantly advance beyond its boundaries existing upon consumption of the metal layer overlying the gate alloy region.

31. A method as claimed in claim 29, further comprising the steps of:
   d) removing the unconsumed metal from the silicon body; and
   e) forming silicide regions from the alloy regions.

32. A method as claimed in claim 31, wherein said forming step (e) is perfomred by rapid thermal annealing of the alloy regions to produce the silicide regions.

33. A method as claimed in claim 29, wherein said amorphous step (a) is performed by implanting ions into the silicon substrate to produce the amorphized regions.

34. A method as claimed in claim 29, wherein said forming step (b) is performed by sputtering the metal onto the amorphized regions.

35. A method as claimed in claim 29, wherein said forming step (b) is performed by evaporating the metal onto the amorphized regions.

36. A method as claimed in claim 29, wherein said forming step (b) is performed by forming the metal in contact with the amorphized regions using chemical vapor deposition.

37. A method as claimed in claim 29, wherein the metal layer is formed in said step (b) with a thickness that produces an approximately stoichiometric alloy region upon consumption of the metal layer overlying the amorphous region by irradiation in said step (c).

38. A method as claimed in claim 29, wherein said irradiating step (c) is performed by irradiating the metal with laser light having a fluence in a range from 0.1 to 1.0 Joules per square centimeter.

39. A method as claimed in claim 38, wherein said irradiating step (c) is performed by irradiating the laser light in a series of shots.

40. A method as claimed in claim 39, wherein a predetermined number of shots in a range from 3 to 10 are delivered to the metal with a duration of 10 to 100 nanoseconds.

41. A method as claimed in claim 29, wherein the thickness of the alloy region over the gate is determined by the thickness of the metal layer formed in said step (b), and wherein the thickness of the silicide in the source and drain regions is determined by the depth to which the amorphizing is performed in said step (a).

42. A method as claimed in claim 29, wherein the fluence is within a range necessary to consume the metal layer formed in said step (b) in areas overlying the gate region and to allow the alloy region to grow to amorphization depths in the source and drain regions resulting from said step (a).

* * * * *